(12) United States Patent
Barthel et al.

(10) Patent No.: US 11,190,176 B2
(45) Date of Patent: Nov. 30, 2021

(54) METHOD AND SIGNAL ANALYSIS INSTRUMENT FOR ANALYZING A PULSE MODULATED SIGNAL

(71) Applicant: Rohde & Schwarz GmbH & Co. KG, Munich (DE)

(72) Inventors: Sven Barthel, Munich (DE); Andreas Werner, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/813,433

(22) Filed: Mar. 9, 2020

(65) Prior Publication Data

US 2021/0281256 A1    Sep. 9, 2021

(51) Int. Cl.
*H03K 7/06*    (2006.01)
*H03D 3/04*    (2006.01)

(52) U.S. Cl.
CPC ................. *H03K 7/06* (2013.01); *H03D 3/04* (2013.01)

(58) Field of Classification Search
CPC .................................. H03K 7/06; H03D 3/04
See application file for complete search history.

(56) References Cited

U.S. PATENT DOCUMENTS

| | | |
|---|---|---|
| 5,223,784 A | 6/1993 | Nelson et al. |
| 6,181,587 B1 | 1/2001 | Kuramoto et al. |
| 2012/0326657 A1* | 12/2012 | Oettinger ................ H04L 7/042 320/108 |

* cited by examiner

*Primary Examiner* — Jeffrey M Shin
(74) *Attorney, Agent, or Firm* — Christensen O'Connor Johnson Kindness PLLC

(57) ABSTRACT

The present disclosure relates to a method of analyzing a pulse modulated signal, wherein the method comprises: receiving a pulse modulated signal; determining a dynamic threshold level based on a period of the pulse modulated signal and the pulse modulated signal; and demodulating the pulse modulated signal by the dynamic threshold level. Moreover, a signal analysis instrument for analyzing a pulse modulated signal is described.

17 Claims, 6 Drawing Sheets

-Prior art-

METHOD AND SIGNAL ANALYSIS INSTRUMENT FOR ANALYZING A PULSE MODULATED SIGNAL

FIELD OF THE DISCLOSURE

Embodiments of the present disclosure generally relate to a method of analyzing a pulse modulated signal. Moreover, embodiments of the present disclosure generally relate to a signal analysis instrument for analyzing a pulse modulated signal.

BACKGROUND

In the state of the art, it is known to analyze pulse modulated signals by means of a signal analyzing instrument like an oscilloscope. For instance, the respective pulse modulated signals correspond to pulse width modulated (PWM) signals or pulse density modulated (PDM) signals. Generally, pulse-width modulation (PWM) is a method of reducing the average power delivered by an electrical signal, by effectively chopping the signal up into discrete parts. Further, pulse-density modulation (PDM) is a form of modulation used to represent an analog signal with a binary signal. In fact, pulse-width modulation is a special case of the pulse-density modulation.

Typically, a static or rather constant value is used for analyzing or rather demodulating the respective pulse modulated signal. Based on the static or rather constant value, a threshold is generated that is used to distinguish between an upper level and a lower level of the respective pulse modulated signal to be analyzed. However, pulse modulated signals are known that are floating with regard to their upper and lower levels. Put differently, these pulse modulated signals do not have a fixed upper level and/or a fixed lower level, but varying one(s). This complicates the decoding of the pulse modulated signals since gaps occur when analyzing those pulse modulated signals which in turn results in a loss of information. Obviously, a loss of information of the original pulse modulated signal to be analyzed is not intended when analyzing the respective pulse modulated signal.

SUMMARY

Accordingly, there is a need for a method of analyzing a pulse modulated signal which ensures proper analysis of floating signals.

The present disclosure provides a method of analyzing a pulse modulated signal. In an embodiment, the method comprises the steps of:

receiving a pulse modulated signal;

determining a dynamic threshold level based on a period of the pulse modulated signal and the pulse modulated signal; and demodulating the pulse modulated signal by the dynamic threshold level.

Accordingly, the present disclosure ensures that non-static pulse modulated signals can be analyzed in an efficient manner while providing a dynamic threshold level instead of a threshold level based on a constant or rather static value, namely a static threshold level. Therefore, the respective dynamic threshold level used for demodulating the pulse modulated signal is automatically adapted with regard to the pulse modulated signal to be analyzed. Put differently, upper and lower levels of the pulse modulated signal can be distinguished even though these levels are non-static ones.

These non-static levels of the pulse modulated signal do not complicate the analysis and, therefore, the decoding of the respective pulse modulated signal due to the dynamic threshold level that is used for demodulating the pulse modulated signal.

In some embodiments, a continuous threshold level, for example a non-static one, is generated that might be new (with respect to its value) for each individual sample of the pulse modulated signal. The dynamic threshold level comprises several individual threshold level values due to its dynamic. Accordingly, a respective individual threshold level value is applied on each individual sample of the pulse modulated signal. The dynamic threshold level can ensure that the threshold level is (always or at least mostly) located within the range provided by the pulse modulated signal which in turn improves the decoding of the pulse modulated signal.

The period of the pulse modulated signal may be determined or rather received for further processing, namely determining the dynamic threshold level.

Generally, the demodulation may provide an output signal that can be further processed or further decoded. Thus, the duty cycle and/or the period of the pulse modulated signal may be determined. Moreover, at least one trigger may be applied on the output signal.

According to an aspect of the present disclosure, the dynamic threshold level varies in time. Since the pulse modulated signal may vary in time, the dynamic threshold level determined based on the pulse modulated signal, for example its respective values, also varies in time. This means that the dynamic threshold level has different individual threshold level values, yielding the time variation of the dynamic threshold level.

Another aspect provides that a moving average is used when determining the dynamic threshold level. The moving average concerns the value(s) of the pulse modulated signal. Accordingly, a non-fixed average of the pulse modulated signal is taken into consideration when determining the dynamic threshold level. In other words, the dynamic threshold level is continuously adapted with regard to the pulse modulated signal, for example its average, since the moving average is used when determining the dynamic threshold level. This ensures that the dynamic threshold level is enabled to follow level variations of the pulse modulated signal.

In some embodiments, the dynamic threshold level is determined by a filter. The filter is a signal processing filter that is configured to process the pulse modulated signal or rather a representative thereof, for instance digitized data associated with the pulse modulated signal.

Further, the filter may comprise at least one of a low pass, a high pass, a weighting, a mean calculation and a moving average. Therefore, different values associated with the pulse modulated signal to be analyzed can be determined by the filter in order to calculate or rather generate the dynamic threshold level to be applied when analyzing the pulse modulated signal. As mentioned above, the dynamic threshold level is determined based on the period of the pulse modulated signal and the pulse modulated signal itself, namely its respective actual value(s), for example the actual value(s) of the respective sample(s).

Another aspect provides that a decimation interval is determined based on the period of the pulse modulated signal. The computational efforts required for analyzing the pulse modulated signal can be reduced in an appropriate manner since the number of data points is reduced by the decimation interval. The decimation interval corresponds to the number of samples in the respective time interval. In some embodiments, the (time) interval is associated with the period of the pulse modulated signal.

In general, a decimation by a factor of 10 actually means that the number of data is divided by a factor of 10. Accordingly, this factor multiplies the sampling interval or, equivalently, divides the sampling rate. For example, a signal with 45,000 samples/second is decimated by a factor of 5/4, the resulting sample rate is 36,000. In some embodiments, different values for decimating may be applied.

In some embodiments, a maximum value and a minimum value are determined within the decimation interval. The maximum value and the minimum value relate to the respective values of the pulse modulated signal within the decimation interval. The maximum value and the minimum value can be determined by the filter.

Further, the dynamic threshold level corresponds to half of the difference of the maximum value and the minimum value. Hence, the minimum value is subtracted from the maximum value in order to determine the difference. Then, the half of the difference determined is used as the respective dynamic threshold level for demodulating the pulse modulated signal. The dynamic threshold level may be calculated by the filter.

The dynamic threshold level may be forwarded to a comparator that compares the pulse modulated signal (or a representative thereof) with the dynamic threshold level for demodulating the pulse modulated signal. Generally, the comparator compares two signals, for instance voltages or currents, and may output a digital signal indicating which of the input signals is larger. Since the comparator receives the pulse modulated signal and the dynamic threshold level, the digital signal outputted corresponds to a pulse modulated signal. The output signal may correspond to the demodulated signal.

Moreover, a mean value and a root mean square (RMS) value may be determined within the decimation interval. The mean value as well as the root mean square value may be used for determining the dynamic threshold level associated with the respective decimation interval.

For instance, the dynamic threshold level corresponds to a quotient of the mean value and the root mean square value. The mean value and the root mean square value also vary in time—when looking at time intervals being larger than the decimation interval—such that the dynamic threshold level provided by the respective quotient also varies in time.

The decimation interval may be determined over more than one period of the pulse modulated signal. For instance, two (or more) periods of the pulse modulated signal are used for the respective decimation interval.

In general, the dynamic threshold level may relate to respective constant values for each decimation interval. Hence, the dynamic threshold level corresponds to a sample and hold function. Between the respective constant values associated with the decimation intervals, an interpolation may take place, for instance a linear one or a sinusoidal one.

Further, the pulse modulated signal may be acquired when the pulse modulated signal is received. This means that the pulse modulated signal is received as an analog signal and sampled in order to obtain the respective samples associated with the pulse modulated signal, namely the digitized data. Then, these samples are processed for analyzing the pulse modulated signal as described above. The acquired samples may be (temporarily) stored in an acquisition memory that is accessed for receiving the samples of the pulse modulated signal for analyzing purposes.

Alternatively, the pulse modulated signal is obtained from a memory when the pulse modulated signal is received. Thus, the analysis may correspond to a post-processing of an already acquired signal while accessing the memory that comprises the already digitized data, namely the samples. Thus, the memory from which the pulse modulated signal (or rather a representative thereof) is obtained may correspond to an acquisition memory.

Alternatively, a memory other than the acquisition memory may provide the respective data associated with the pulse modulated signal for the analysis of the pulse modulated signal.

Another aspect provides that the period of the pulse modulated signal is determined automatically. This can be done by identifying signal edges within the pulse modulated signal such that the period can be determined automatically based on the signal edges identified.

Alternatively, the period of the pulse modulated signal may be determined based on a manual input. The manual input may be provided by a user that has a priori knowledge of the respective pulse modulated signal to be analyzed.

For instance, the manual input corresponds to a frequency of the pulse modulated signal and/or the period of the pulse modulated signal. Based on the manual input, the period of the pulse modulated signal can be determined. In some embodiments, the period can be calculated from the frequency of the pulse modulated signal.

For instance, a transform, for example a fast Fourier transform (FFT), or a derivation of the acquired data may be used in order to determine the period of the pulse modulated signal.

According to another aspect, the dynamic threshold level is determined also based on a signal length of the pulse modulated signal. The signal length may be recorded automatically when receiving the pulse modulated signal.

Furthermore, the dynamic threshold level may be determined also based on a sample rate of the pulse modulated signal. The sample rate may also be recorded automatically when receiving the pulse modulated signal.

For instance, the pulse modulated signal is a pulse width modulated (PWM) signal and/or a pulse density modulated (PDM) signal. Thus, different kinds of pulse modulated signals may be analyzed appropriately.

In addition, the present disclosure provides a signal analysis instrument for analyzing a pulse modulated signal. In an embodiment, the signal analysis instrument comprises an input, a signal processing circuit, a comparator, such as a comparator circuit, and a signal output. The input receives a pulse modulated signal. The signal processing member determines a dynamic threshold level based on a period of the pulse modulated signal and the pulse modulated signal. The comparator receives the dynamic threshold level and the pulse modulated signal. The comparator demodulates the pulse modulated signal while taking the dynamic threshold level and the pulse modulated signal into consideration.

Generally, the signal analysis instrument, for instance an oscilloscope, is configured to perform the method described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
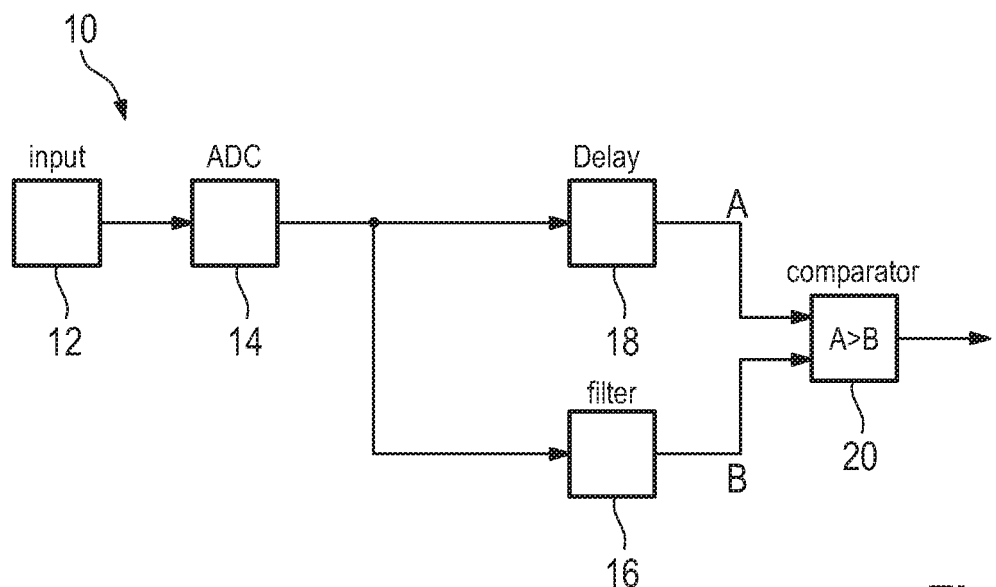
FIG. 1 schematically shows a block diagram of a signal analysis instrument according to an embodiment of the present disclosure.

FIG. 1 shows a block diagram of a signal analysis instrument 10 that has an input 12 for receiving a pulse modulated signal to be analyzed, for example an analog pulse modulated signal. The input 12 is connected with, for example, an analog-to-digital converter 14, abbreviated by ADC, that is located downstream of the input 12. The analog-to-digital converter 14 samples the (analog) pulse modulated signal by digitizing the pulse modulated signal in order to obtain samples for further processing.

In the context of the present disclosure, the terms "downstream" and "upstream" are understood to denote directions of signal propagation within the signal analysis instrument 10, wherein electrical signals propagate from the upstream component to the downstream component. In FIG. 1, the directions of signal propagation are indicated by the respective arrows.

The analog-to-digital converter 14 is connected with a filter 16 that processes the digitized data received from the analog-to-digital converter 14, namely the respective samples. The filter 16 is generally configured to determine a dynamic threshold level based on a period of the pulse modulated signal and the pulse modulated signal itself, namely the actual values of the samples received.

The period may be determined automatically by the filter 16 itself. Alternatively, the period may be inputted manually by a user of the signal analysis instrument 10. Furthermore, the user may input a frequency that is used to calculate the period of the pulse modulated signal. In any case, the filter 16 provides a dynamic threshold level. In an embodiment, the filter can be implemented in circuitry, such as in hardware or in software or in a combination of hardware and software, for carrying out the functionality described herein.

In addition, the signal analysis instrument 10 has a delay circuit or module 18 that receives the digitized data, namely the samples, from the analog-to-digital converter 14. The delay module 18 compensates the delay introduced by the filter 16 when processing the digitized data received from the analog-to-digital converter 14 in order to determine the dynamic threshold level.

The delayed digitized data as well as the dynamic threshold level determined are forwarded to a comparator circuit, such as comparator 20, located downstream of the filter 16 and/or the delay module 18. The comparator 20 applies the dynamic threshold level while comparing the dynamic threshold level with the pulse modulated signal, for example the digitized data associated therewith. This is illustrated in FIGS. 2 and 3 in more detail to which reference is made hereinafter.

Figure 2:
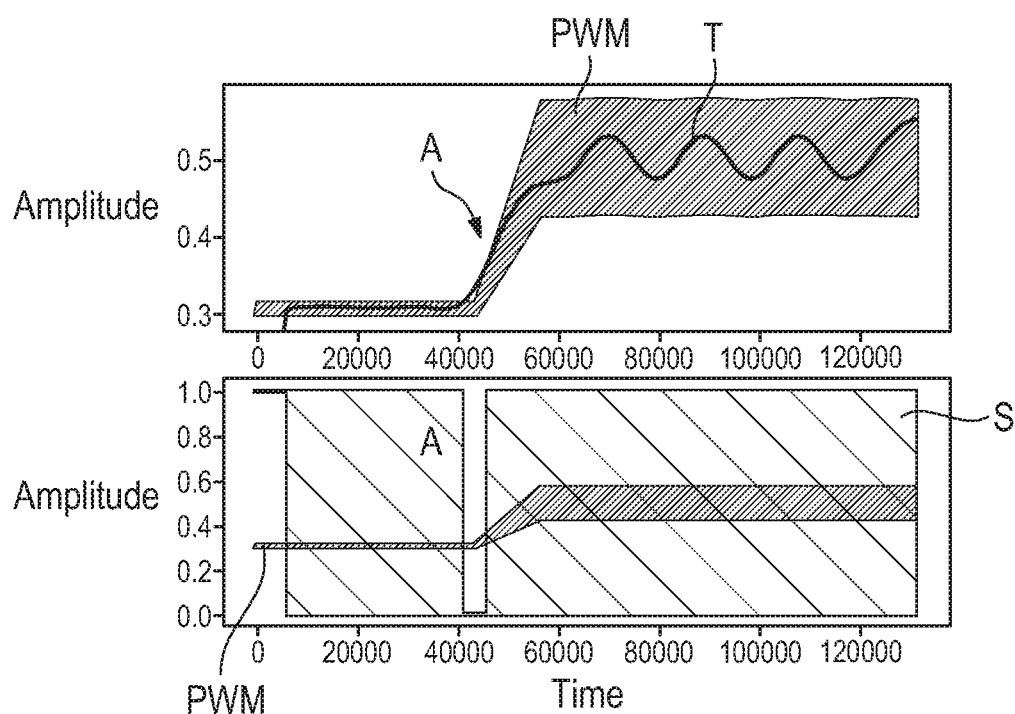
FIG. 2 shows an overview with a first diagram illustrating a pulse modulated signal and a dynamic threshold level as well as a second diagram illustrating the pulse modulated signal and an output signal according to a first decimation interval.
Figure 3:
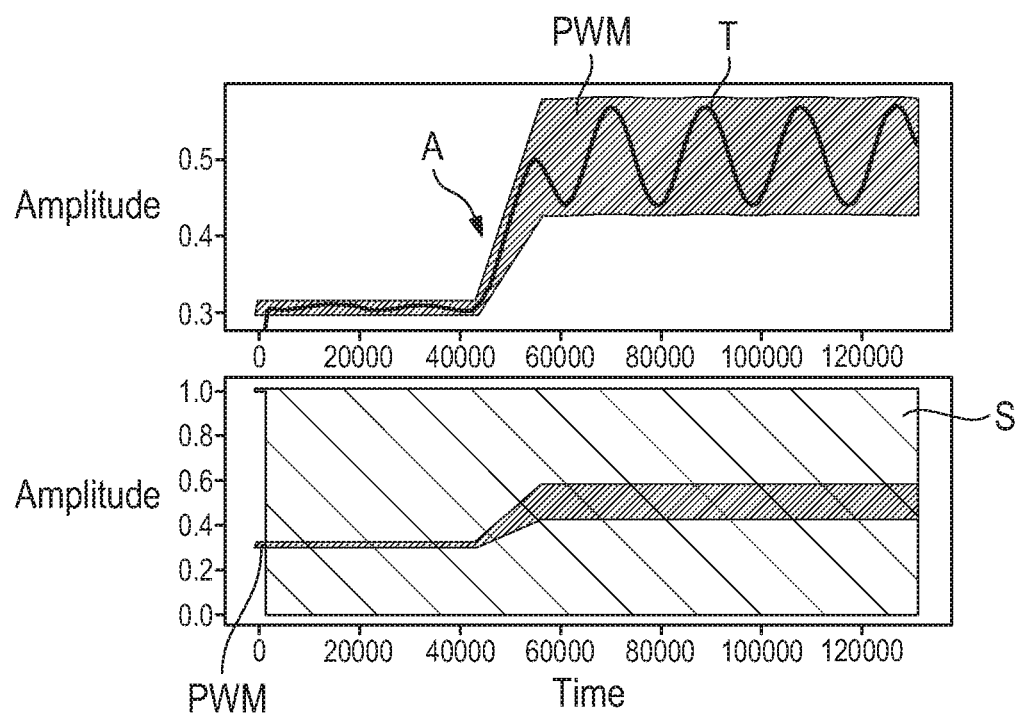
FIG. 3 shows an overview with a first diagram illustrating a pulse modulated signal and a dynamic threshold level as well as a second diagram illustrating the pulse modulated signal and an output signal according to a second decimation interval.

FIG. 2 shows an upper diagram illustrating 130,000 input samples of a pulse modulated signal, namely a pulse width modulated signal (PWM). The respective samples were obtained by the analog-to-digital converter 14 when digitizing the input signal received via the input 12.

The upper diagram also illustrates the dynamic threshold level T determined by the filter 18. It becomes obvious from FIG. 2 that the dynamic threshold level T varies in time since its respective individual values dynamically vary over time.

In some embodiments, the dynamic threshold level T is determined based on a moving average of the pulse modulated signal in a certain decimation interval. In some embodiments, a decimation by a factor of 10 of the samples was used as indicated in FIG. 2 by "Sa/10" which means that the amount of data is reduced appropriately.

Generally, the decimation interval is determined based on the period of the pulse modulated signal. For instance, the decimation interval corresponds to the time interval of at least one period of the pulse modulated signal, namely the respective samples obtained within that time interval. Accordingly, the decimation interval also depends on the sample rate.

In the example shown, 13,000 samples, namely a tenth of all samples, are used to generate a mean value that varies in time. Put differently, the respective mean value is adapted continuously, resulting in the moving average. The lower diagram illustrates the pulse modulated signal and an output signal S of the comparator 20 which is a binary signal that has the values "1" or "0" depending on the comparison performed. In some embodiments, the dynamic threshold level is determined by an average filter.

In FIG. 3, the same pulse modulated signal is shown, wherein the dynamic threshold level is determined based on another decimation interval compared to FIG. 2. For example, the filter 16 has a width of the number of samples divided by 50 ("Sa/50"). Since 130,000 samples were acquired, 2,600 samples are used to determine the respective mean value that continuously varies in time (moving average). Comparing FIGS. 2 and 3 reveal that the dynamic threshold level provided by less samples is more accurate since the dynamic threshold level is always located within the range of the pulse modulated signal even in its transition area A.

Figure 4:
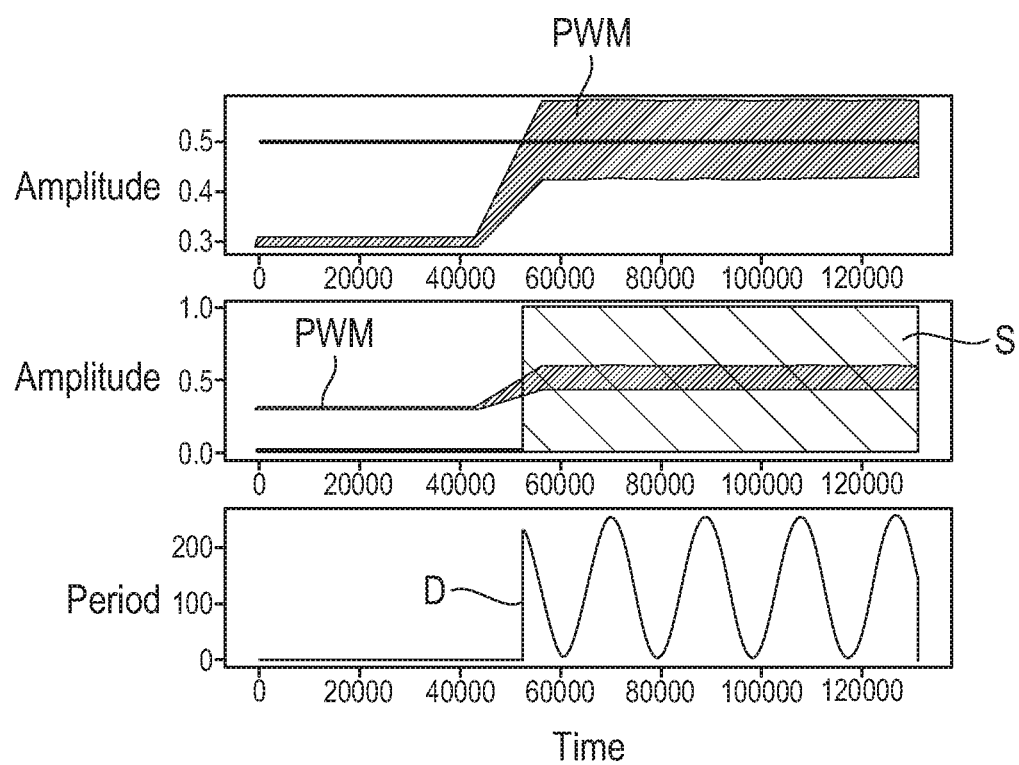
FIG. 4 shows an overview with a first diagram illustrating a pulse modulated signal and a static threshold level according to the prior art, a second diagram illustrating the pulse modulated signal and an output signal according to the prior art as well as a third diagram illustrating a decoded pulse width of the pulse modulated signal.

In FIG. 4, an overview is shown that uses a static threshold level as known in the state of the art. The upper and middle diagrams correspond to the ones shown before in FIGS. 2 and 3, respectively.

The lower diagram in the overview of FIG. 4 illustrates a decoded pulse width D of the pulse modulated signal. From the overview, it becomes obvious that certain portions of the pulse modulated signal cannot be detected, resulting in loss of information.

Figure 5:
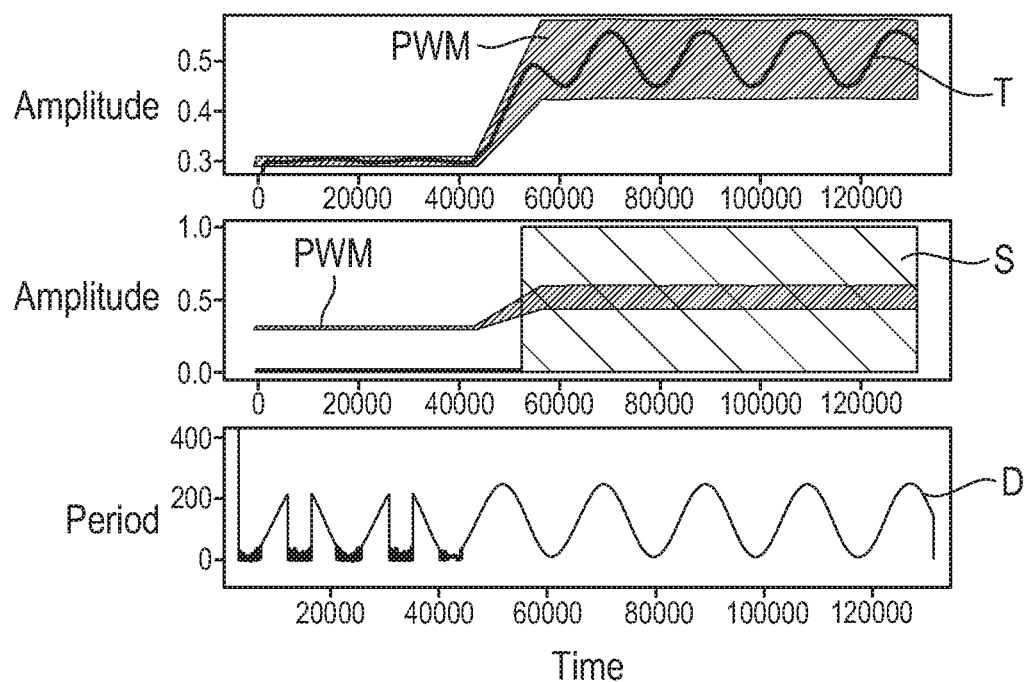
FIG. 5 shows an overview with a first diagram illustrating a pulse modulated signal and a dynamic threshold level according to a first decimation interval, a second diagram illustrating the pulse modulated signal and an output signal according to the first decimation interval as well as a third diagram illustrating a decoded pulse width of the pulse modulated signal.

In contrast thereto, FIG. 5 shows an overview illustrating the method according to an embodiment of the present disclosure which uses a dynamic threshold level that varies over time since the dynamic threshold level is determined based on the pulse modulated signal and its period. It is shown that it is possible to decode the pulse modulated signal substantially over its entire length such that decoding of the pulse modulated signal is improved. This becomes obvious when comparing the left portion of the lower diagrams of the overviews shown in FIGS. 4 and 5.

In FIG. 5, a decimation interval associated with a factor 20 ("Sa/20"). This means that the (moving) average was calculated by a reduced number of samples, namely by 6,500 samples (130,000/20 samples). Accordingly, the filter 16 corresponds to an average filter.

Figure 6:
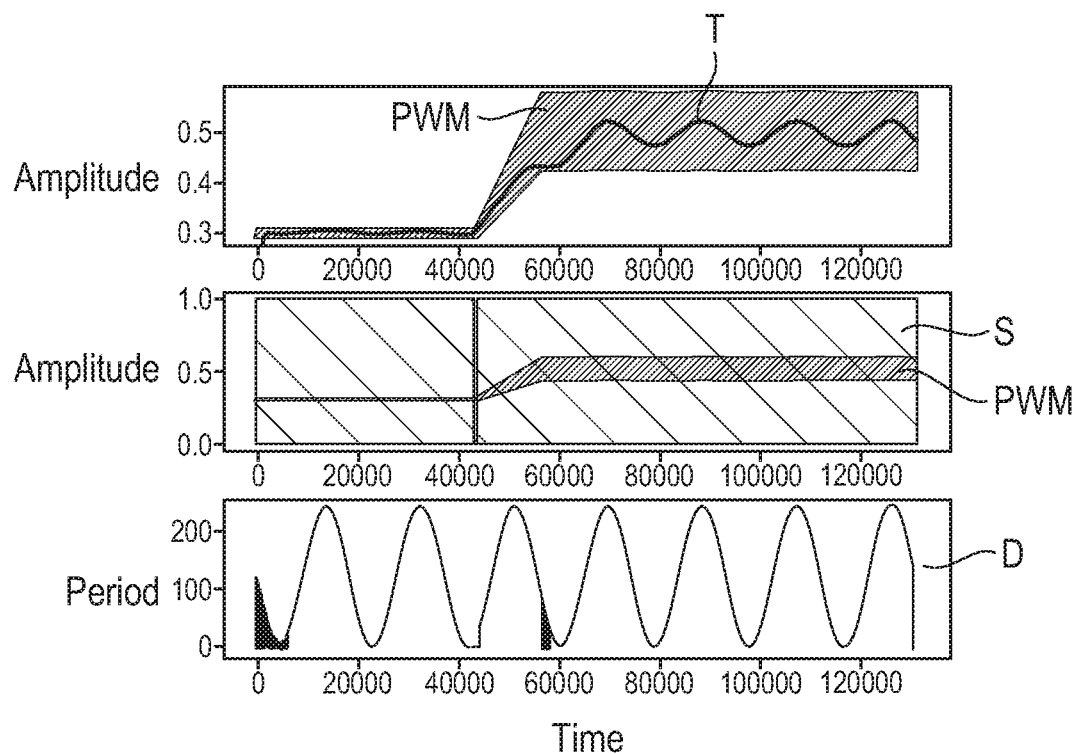
FIG. 6 shows an overview with a first diagram illustrating a pulse modulated signal and a dynamic threshold level according to a second decimation interval, a second diagram illustrating the pulse modulated signal and an output signal according to the second decimation interval as well as a third diagram illustrating a decoded pulse width of the pulse modulated signal.

In FIG. 6, another overview is shown, wherein the dynamic threshold level was determined based on a weighting (weighted filter). For instance, all samples are summed up to a sum Σ, wherein the dynamic threshold level T is determined based on a linear behavior. This means that a first coefficient a that is multiplied with the sum obtained Σ plus a second coefficient b multiplied by the actual value V of the pulse modulated signal, namely the value of the actual sample. This can be expressed as following:

$$T = a*\Sigma + b*V$$

This results in the dynamic threshold level, as the actual value of the pulse modulated signal varies over time. The respective coefficients can be chosen such that they together sum up to 1. For instance, the first coefficient "a" may be 0.9999, whereas the second coefficient "b" corresponds to 0.0001. A dynamic threshold level determined as described above is shown in FIG. 6.

Figure 7:
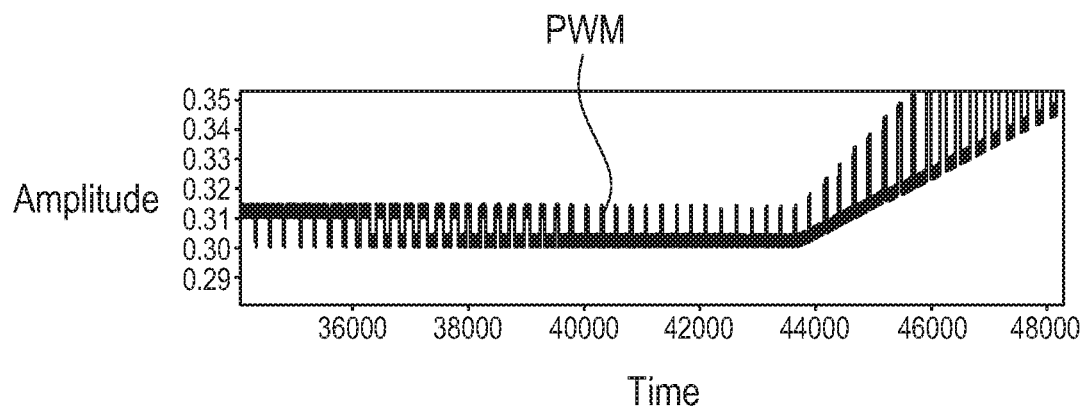
FIG. 7 shows a first detail of the pulse modulated signal shown in FIGS. 2 to 6.
Figure 8:
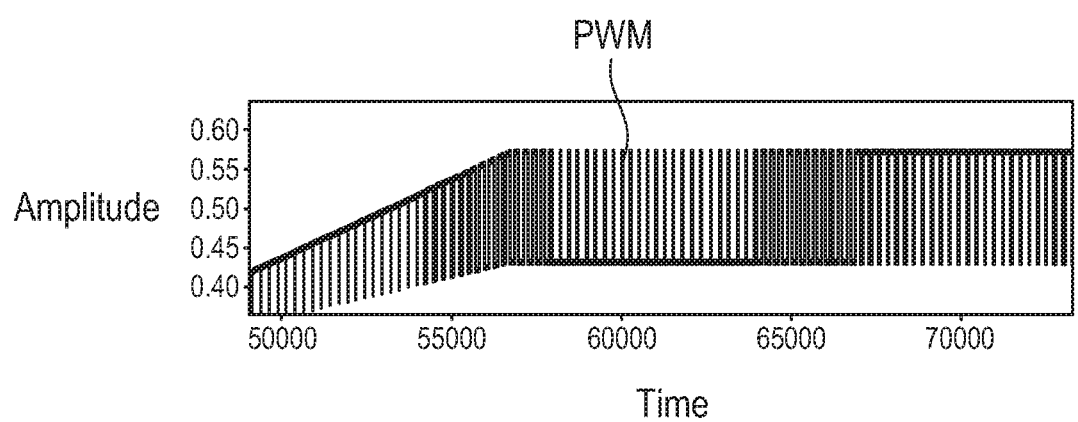
FIG. 8 shows a second detail of the pulse modulated signal shown in FIGS. 2 to 6.

In FIGS. 7 and 8, details of the pulse modulated signal are shown which clearly indicate that the pulse modulated signal shown in FIGS. 2 to 6 corresponds to a pulse width modulated signal.

Figure 9:
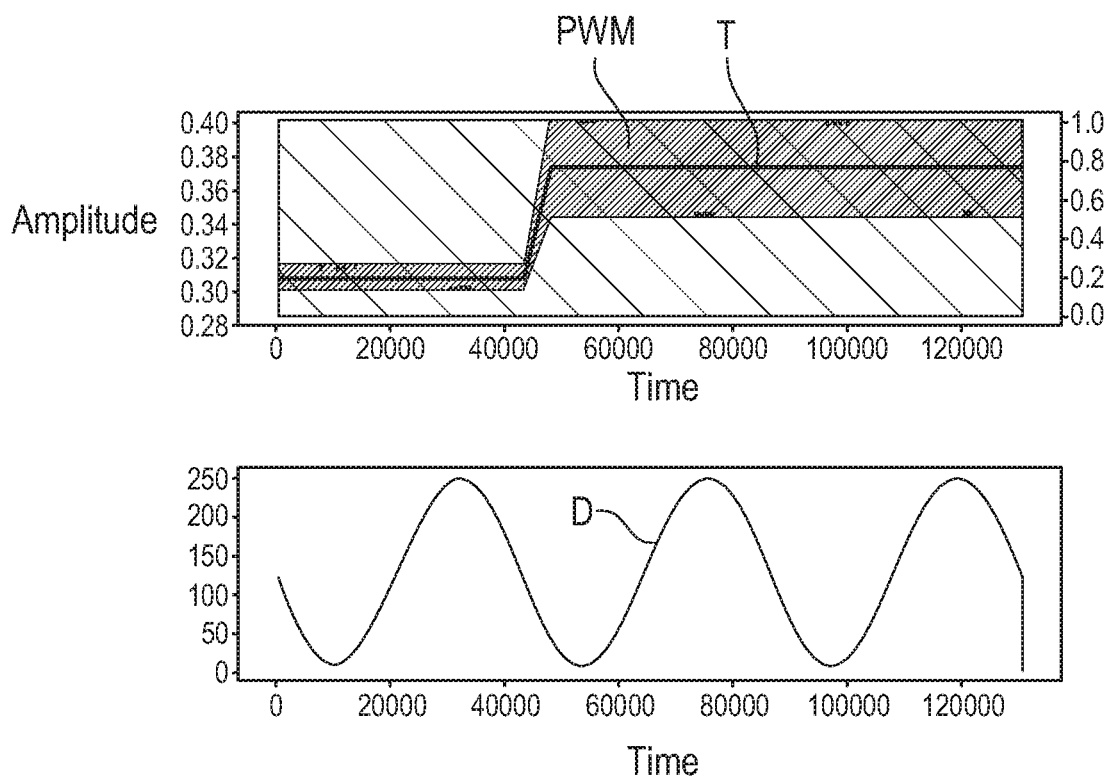
FIG. 9 shows an overview with a first diagram illustrating a pulse modulated signal and a dynamic threshold level as well as a second diagram illustrating a decoded waveform of the pulse modulated signal.

In FIG. 9, another approach to determine the dynamic threshold level is shown. According to this approach, the filter 16 may be established to determine a maximum value and a minimum value of the respective pulse modulated signal in the respective decimation interval, for example the maximum value and the minimum value of the samples within the decimation interval.

Then, the difference of the maximum value and the minimum value is calculated, wherein the dynamic threshold level corresponds to the half of the difference determined. This is also called "peakpeak/2" or "pkpk/2".

As shown in the lower diagram of the overview of FIG. 9, the pulse modulated signal can be decoded over its entire length.

Figure 10:
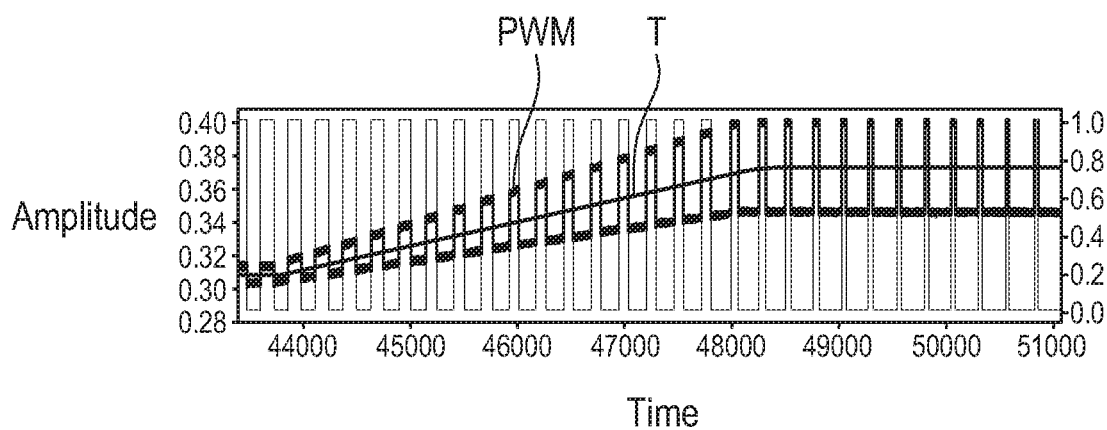
FIG. 10 shows a detail view of a part of the first diagram in FIG. 9.

In FIG. 10, a detail of the upper diagram of the overview of FIG. 9 is shown which illustrates that the dynamic threshold level is always located within the range of the pulse modulated signal.

Figure 11:
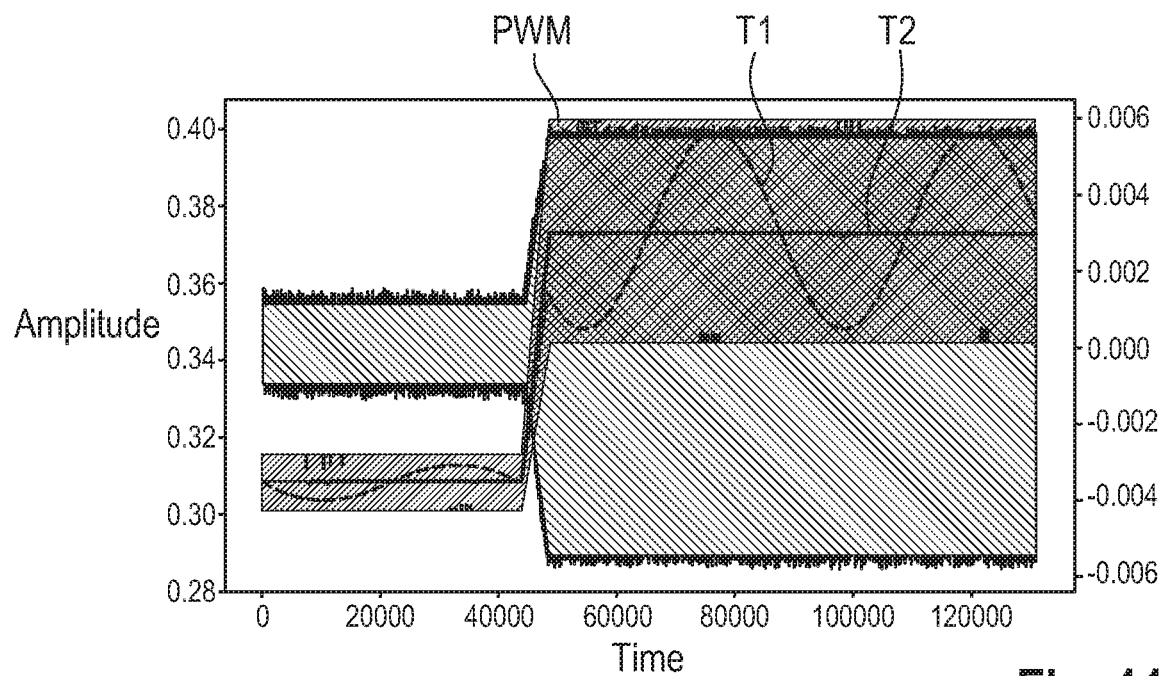
FIG. 11 shows a diagram illustrating a pulse modulated signal and two differently determined dynamic threshold levels.

In an alternative that is shown in FIG. 11, the dynamic threshold level may be determined based on a quotient of a mean value ("Mean") and a root mean square ("RMS") value, wherein the mean value and the root mean square value may be obtained within the respective decimation interval.

In FIG. 11, the dynamic threshold determined based on the difference of the maximum value and the minimum value, also called "peakpeak/2" or "pkpk/2", is also shown for comparison purposes.

Figure 12:
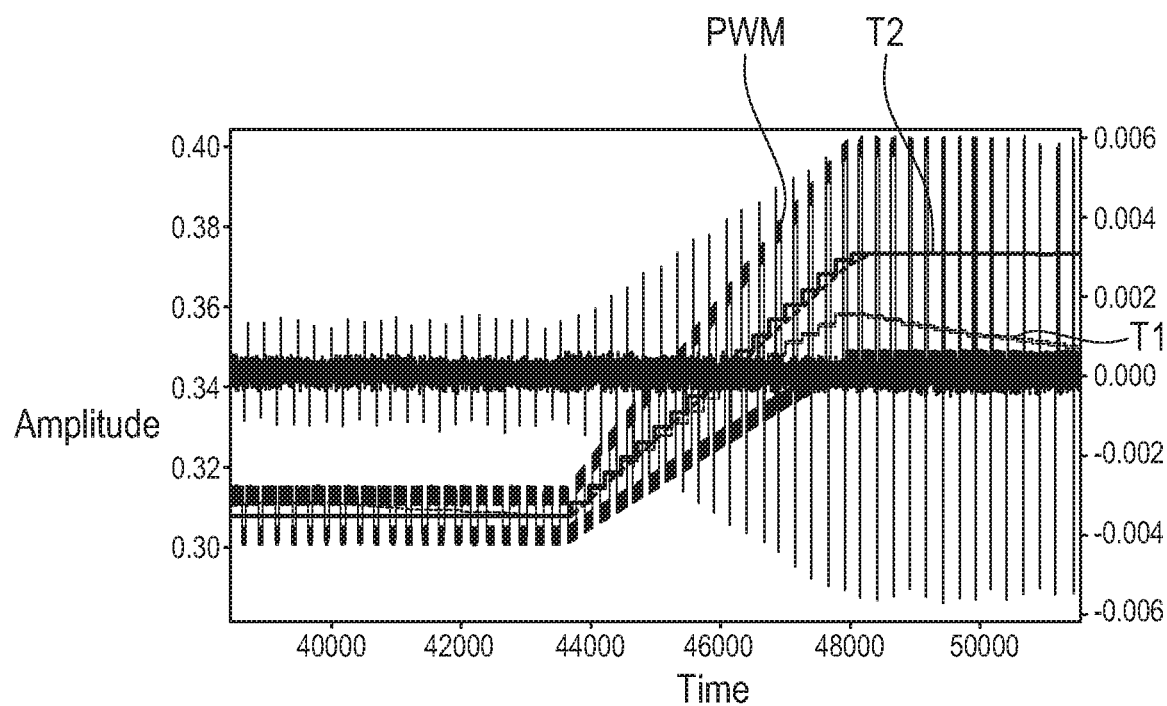
FIG. 12 shows a detail of FIG. 11.

A detail of the diagram of FIG. 11 is shown in FIG. 12 which reveals that dynamic threshold level may relate to respective constant values for each decimation interval. However, an interpolation may take place between the respective constant values associated with the decimation intervals, for instance a linear interpolation or a sinusoidal interpolation.

In general, the decimation interval may correspond to (exactly) one period of the pulse modulated signal. However, the decimation interval may also correspond to more periods, for instance two periods.

Furthermore, the dynamic threshold level may also be determined based on a signal length of the pulse modulated signal and/or a sample rate of the pulse modulated signal. Both parameters of the pulse modulated signal may be determined automatically by the circuit(s) of the signal analysis instrument 10.

In the shown embodiment of FIG. 1, the (analog) pulse modulated signal is acquired when it is received by the signal analysis instrument 10. Accordingly, the analysis takes place immediately after sampling the (analog) pulse modulated signal.

Alternatively to the shown embodiment of FIG. 1, the pulse modulated signal received may be received when accessing a certain memory, for instance an acquisition memory that (temporarily) stores acquired data, namely the respective samples. Accordingly, the samples have already been gathered which are stored for further processing. Hence, the analysis may correspond to a post-processing.

In general, the dynamic threshold level ensures that pulse modulated signals can be analyzed that have a non-static upper level and lower level.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, filter signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A method of analyzing a pulse modulated signal, said method comprising:
   receiving a pulse modulated signal;
   determining a dynamic threshold level based on a period of said pulse modulated signal and said pulse modulated signal; and
   demodulating said pulse modulated signal by said dynamic threshold level,
   wherein a decimation interval is determined based on said period of said pulse modulated signal, and
   wherein either a mean value and a root mean square value are determined within said decimation interval or a maximum value and a minimum value are determined within said decimation interval, said dynamic threshold level corresponding to half of the difference of said maximum value and said minimum value.

2. The method according to claim 1, wherein said dynamic threshold level varies in time.

3. The method according to claim 1, wherein a moving average is used when determining said dynamic threshold level.

4. The method according to claim 1, wherein said dynamic threshold level is determined by a filter.

5. The method according to claim 4, wherein said filter comprises at least one of a low pass, a high pass, a weighting, a mean calculation and a moving average.

6. The method according to claim 1, wherein, in case of determining said mean value and said root mean square value within said decimation interval, said dynamic threshold level corresponds to a quotient of said mean value and said root mean square value.

7. The method according to claim 1, wherein said decimation interval is determined over more than one period of said pulse modulated signal.

8. The method according to claim 1, wherein said pulse modulated signal is acquired when said pulse modulated signal is received.

9. The method according to claim 1, wherein said pulse modulated signal is got from a memory when said pulse modulated signal is received.

10. The method according to claim 1, wherein said period of said pulse modulated signal is determined automatically.

11. The method according to claim 1, wherein said period of said pulse modulated signal is determined based on a manual input.

12. The method according to claim 11, wherein said manual input corresponds to at least one of a frequency of said pulse modulated signal and said period of said pulse modulated signal.

13. The method according to claim 1, wherein said dynamic threshold level is determined also based on a signal length of said pulse modulated signal.

14. The method according to claim 1, wherein said dynamic threshold level is determined also based on a sample rate of said pulse modulated signal.

15. The method according to claim 1, wherein said pulse modulated signal is at least one of a pulse width modulated (PWM) signal and a pulse density modulated (PDM) signal.

16. A signal analysis instrument for analyzing a pulse modulated signal, the signal analysis instrument comprising an input, a signal processing circuit, a comparator, and a signal output,
   wherein said input receives a pulse modulated signal,
   wherein said signal processing circuit determines a dynamic threshold level based on a period of said pulse modulated signal and said pulse modulated signal,
   wherein said comparator receives said dynamic threshold level and said pulse modulated signal,
   wherein said comparator demodulates said pulse modulated signal while taking said dynamic threshold level and said pulse modulated signal into consideration,
   wherein said signal processing circuit determines a decimation interval based on said period of said pulse modulated signal, and
   wherein either said signal processing circuit determines a mean value and a root mean square value within said decimation interval or said signal processing circuit determines a maximum value and a minimum value within said decimation interval, said dynamic threshold level corresponding to half of the difference of said maximum value and said minimum value.

17. A method of analyzing a pulse modulated signal, said method comprising:
- receiving a non-static pulse modulated signal;
- determining a dynamic threshold level based on a period of said pulse modulated signal and said pulse modulated signal; and
- demodulating said pulse modulated signal by said dynamic threshold level,
- wherein the dynamic threshold level used for demodulating the pulse modulated signal is automatically adapted with regard to the pulse modulated signal to be analyzed such that a respective individual threshold level value is applied on each individual sample of the pulse modulated signal.

* * * * *